(12) United States Patent
Omura et al.

(10) Patent No.: US 8,143,115 B2
(45) Date of Patent: Mar. 27, 2012

(54) METHOD FOR MANUFACTURING THIN FILM TRANSISTOR USING OXIDE SEMICONDUCTOR AND DISPLAY APPARATUS

(75) Inventors: Hideyuki Omura, Tokyo (JP); Ryo Hayashi, Yokohama (JP); Nobuyuki Kaji, Kawasaki (JP); Hisato Yabuta, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 143 days.

(21) Appl. No.: 12/515,267

(22) PCT Filed: Nov. 29, 2007

(86) PCT No.: PCT/JP2007/073529
§ 371 (c)(1),
(2), (4) Date: May 15, 2009

(87) PCT Pub. No.: WO2008/069255
PCT Pub. Date: Jun. 12, 2008

(65) Prior Publication Data
US 2010/0065837 A1    Mar. 18, 2010

(30) Foreign Application Priority Data

| Dec. 5, 2006 | (JP) | 2006-328308 |
| May 30, 2007 | (JP) | 2007-143503 |
| Oct. 22, 2007 | (JP) | 2007-273863 |
| Nov. 5, 2007 | (JP) | 2007-287401 |

(51) Int. Cl.
*H01L 29/786* (2006.01)
*H01L 21/34* (2006.01)
*H01L 33/00* (2006.01)
*H01L 21/336* (2006.01)

(52) U.S. Cl. ..... 438/158; 257/43; 257/59; 257/E33.053; 257/E21.459; 257/E21.414; 257/E29.296; 438/104

(58) Field of Classification Search ........... 257/E29.101, 257/43; 438/158
See application file for complete search history.

(56) References Cited

U.S. PATENT DOCUMENTS
6,303,946 B1    10/2001    Sung
(Continued)

FOREIGN PATENT DOCUMENTS
JP    11-40814 A    2/1999
(Continued)

OTHER PUBLICATIONS

PCT International Search Report and Written Opinion of the International Searching Authority in International Application No. PCT/JP2007/073529, Mailing Date Mar. 11, 2008.
(Continued)

*Primary Examiner* — Fernando L Toledo
*Assistant Examiner* — Robert Carpenter
(74) *Attorney, Agent, or Firm* — Fitzpatrick, Cella, Harper & Scinto

(57) ABSTRACT

A thin film transistor is manufactured by forming a gate electrode on a substrate, forming a first insulating film on the gate electrode, forming an oxide semiconductor layer on the first insulating film with an amorphous oxide, patterning the first insulating film, patterning the oxide semiconductor layer, forming a second insulating film on the oxide semiconductor layer in an oxidative-gas-containing atmosphere, patterning the second insulating film to expose a pair of contact regions, forming an electrode layer on the pair of contact regions, and patterning the electrode layer to for a source electrode and a drain electrode.

10 Claims, 9 Drawing Sheets

U.S. PATENT DOCUMENTS

| | | | |
|---|---|---|---|
| 6,331,474 B1 | 12/2001 | Hayashi et al. | |
| 6,563,174 B2 | 5/2003 | Kawasaki et al. | |
| 6,794,275 B2 | 9/2004 | Kondo et al. | |
| 6,855,621 B2 | 2/2005 | Kondo et al. | |
| 6,858,308 B2 | 2/2005 | Kondo et al. | |
| 7,282,132 B2 | 10/2007 | Iwata et al. | |
| 7,382,421 B2 | 6/2008 | Hoffman et al. | |
| 7,385,224 B2 | 6/2008 | Ishii et al. | |
| 7,501,293 B2 | 3/2009 | Ito et al. | |
| 2001/0036733 A1 | 11/2001 | Luo et al. | |
| 2006/0051905 A1 | 3/2006 | Chen et al. | |
| 2006/0108529 A1* | 5/2006 | Saito et al. | 250/338.4 |
| 2006/0113539 A1* | 6/2006 | Sano et al. | 257/59 |
| 2006/0244107 A1 | 11/2006 | Sugihara et al. | |
| 2007/0063211 A1* | 3/2007 | Iwasaki | 257/98 |
| 2007/0072439 A1* | 3/2007 | Akimoto et al. | 438/795 |
| 2007/0090365 A1 | 4/2007 | Hayashi et al. | |
| 2008/0258141 A1* | 10/2008 | Park et al. | 257/43 |

FOREIGN PATENT DOCUMENTS

| | | |
|---|---|---|
| JP | 2002-289859 A | 10/2002 |
| JP | 2006-100760 A | 4/2006 |
| TW | 442979 B | 6/2001 |
| WO | 2006/051995 A1 | 5/2006 |

OTHER PUBLICATIONS

Yabuta, et al., "High-mobility thin-film tansistor with amorphous InGaZnO4 channel fabricated by room temperature rf-magnetron sputtering", Applied Physics Letters, vol. 89, 2006, pp. 112123-1-112123-3.

Lee, et al., "Low-resistance and nonalloyed ohmic contacts to plasma treated ZnO", Applied Physics Letters, vol. 78, No. 24, Jun. 11, 2001, pp. 3842-3844.

Suyama, et al., "High-Quality Gate-Oxide Films for Mosfet's Deposited by Oxygen-Argon Sputtering", Applied Surface Science, vol. 33/34, 1988, pp. 1236-1243.

Fujiyama, et al. "Effect of O2 gas partial pressure on mechanical properties of SiO2 films deposited by radio frequency magnetron sputtering", J. Vac. Sci. Technol. A, vol. 20, No. 2, 2002, pp. 356-361.

Nomura, et al, "Amorphous Oxide Semiconductors for High-Performance Flexible Thin-Film Transistors", Japanese Journal of Applied Physics, vol. 45, No. 5B, 2006, pp. 4303-4308.

U.S. Appl. No. 12/089,907, International filing Date Nov. 1, 2006, Aiba, et al.

U.S. Appl. No. 12/374,665, International filing Date Jul. 26, 2007, Itagaki, et al.

U.S. Appl. No. 12/522,371, International filing Date Feb. 4, 2008, Yabuta, et al.

U.S. Appl. No. 12/515,268, International filing Date Nov. 20, 2007, Hayashi, et al.

U.S. Appl. No. 12/534,436, filed Aug. 3, 2009, Hayashi, et al.

Taiwan Office Action dated Dec. 7, 2011 in Taiwan application No. 96145935.

* cited by examiner

METHOD FOR MANUFACTURING THIN FILM TRANSISTOR USING OXIDE SEMICONDUCTOR AND DISPLAY APPARATUS

This application is a National Stage Application under 35 U.S.C. §371 of International Application No. PCT/JP2007/073529, filed on Nov. 29, 2007, which claims priority to four Japanese Applications, namely: Japan 2007-143503, filed on May 30, 2007, Japan 2007-287401, filed on Nov. 5, 2007, Japan 2006-328308, filed on Dec. 5, 2006, and Japan 2007-273863, filed on Oct. 22, 2007, the contents of each of which are incorporated by reference as if set forth in full herein.

TECHNICAL FIELD

This invention relates to a method of manufacturing a thin film transistor using an oxide semiconductor and a display apparatus.

BACKGROUND ART

Thin film transistors having a silicon-based semiconductor layer have been and being employed for switching elements of display apparatus that may be active matrix type liquid crystal display devices or organic electroluminescent devices. For instance, a gate electrode is formed on an insulating substrate and subsequently a gate insulating film is formed on the insulating substrate that includes the gate electrode. Thereafter, a semiconductor layer of amorphous silicon is formed thereon. Then, a channel protective film is formed in a center area of the upper surface of the semiconductor layer and an ohmic contact layer of n-type amorphous silicon is formed at the opposite sides of the protective film on the semiconductor channel layer. Subsequently, a source electrode and a drain electrode are arranged on the ohmic contact layer (Japanese Patent Application Laid-Open No. H11-040814).

However, since a silicon-based semiconductor material as described above is not transparent relative to visible light, conventional thin film transistors using a silicon-based material for the channel layer absorb visible light and can give rise to operation errors. Thus, conventional thin film transistors require a screening layer that prevents external visible light from coming in to make the device show a complex structure and require a complex manufacturing process.

For this reason, efforts have been and being actively paid to develop thin film transistors using a transparent conductive oxide polycrystalline thin film that contains ZnO as principal ingredient. Such a thin film shows a high mobility if compared with an amorphous silicon thin film and can be formed at low temperature. Thus, flexible and transparent thin film transistors can be formed on a substrate that may be a plastic plate or a film. Additionally, such thin film transistors do not require a screening layer because the thin film is transparent to visible light.

Now, an exemplary method of manufacturing a thin film transistor containing ZnO as principal ingredient will be described below. Firstly, a semiconductor layer of intrinsic zinc oxide is formed on a gate insulating film. Then, a protective film having a profile same as the semiconductor layer is formed thereon. Thereafter, an upper insulating film is formed on the upper surface of the protective film and a contact hole is cut through. Subsequently, either an ohmic contact layer of n-type ZnO is formed on the upper surface of the semiconductor layer exposed through the contact hole or the region thereof where the semiconductor layer is brought into contact with electrodes is subjected to a resistance-lowering treatment and then a source electrode and a drain electrode are formed on the upper surface thereof (Japanese Patent Application Laid-Open No. 2006-100760). It will be appreciated that, the above-described method requires either a resistance-lowering treatment or a step of forming an ohmic contact layer for the semiconductor layer in order to establish ohmic contact with the electrodes.

Applied Physics Letters, 89, 112123 (2006) describes a process of producing an excellently flat and uniform semiconductor layer by forming a transparent amorphous oxide semiconductor film (a-IGZO) as channel layer for a thin film transistor by magnetron sputtering at room temperature. The above-cited document describes that a thin film transistor showing a good field effect mobility of 12 $cm^2V^{-1}s^{-1}$ can be obtained by doing so.

However, the above described thin film transistor device does not have an ohmic contact layer and hence there can arise a non-ohmic contact between the oxide semiconductor layer and the source electrode and the drain electrode depending on the selected electrode material.

DISCLOSURE OF THE INVENTION

In view of the above-identified problem, it is therefore the object of the present invention to provide a thin film transistor using an oxide thin film and showing a good ohmic contact between the source electrode and the drain electrode and the oxide semiconductor layer without increasing manufacturing steps The inventors of the present invention paid intensive efforts for research and development of thin film transistors using a transparent oxide semiconductor and found that the above-identified problem can be dissolved by the arrangement described below. That is, a second insulating film of an oxide insulator is formed to cover an oxide semiconductor layer in an oxidative-gas-containing atmosphere. Then, the second insulating film is left only in a channel region as protective layer covering the oxide semiconductor layer, while the other region of the second insulating film covering the oxide semiconductor layer is removed by patterning it to expose the oxide semiconductor layer as a contact region (a region to be electrically connected to an electrode). As a result of the above step, the exposed oxide semiconductor layer is damaged and its electric resistance is lowered to form a contact region. In other words, a channel region and a contact region are produced simultaneously in the oxide semiconductor layer by patterning the second insulating film in this step and the electric resistance of the contact region is lowered. Thereafter, a source electrode and a drain electrode are formed on respective contact regions. Thus, the source electrode and the drain electrode are formed on the contact regions that are produced by lowering the electric resistance of the oxide semiconductor layer. Therefore, a step of forming an ohmic contact layer or a step of lowering the electric resistance of the contact regions to be held in contact with the electrodes are not required to manufacture a thin film transistor showing a good ohmic contact. While a bottom gate type thin film transistor is described above, the present invention can also realize a top gate type thin film transistor.

In an aspect of the present invention, there is provided a method of manufacturing a thin film transistor having on a substrate, at least a gate electrode, a first insulating film, an oxide semiconductor layer, a second insulating film, a source electrode and a drain electrode, including: forming a gate electrode on a substrate; forming a first insulating film on the gate electrode; forming an oxide semiconductor layer on the first insulating film with an amorphous oxide; patterning the first insulating film; patterning the oxide semiconductor layer; forming a second insulating film on the oxide semiconductor layer in an oxidative-gas-containing atmosphere; patterning the second insulating film to expose a pair of contact regions in the oxide semiconductor layer and lower the electric resistance of the contact regions; forming an electrode layer to form a source electrode and a drain electrode.

In another aspect of the present invention, there is provided a method of manufacturing a thin film transistor having on a substrate, at least a gate electrode, an oxide semiconductor layer, a second insulating film, a source electrode and a drain electrode, including: forming an oxide semiconductor layer on a substrate with an amorphous oxide; patterning the oxide semiconductor layer; forming a second insulating film on the oxide semiconductor layer in an oxidative-gas-containing atmosphere; patterning the second insulating film to expose a pair of contact regions in the oxide semiconductor layer and lower the electric resistance of the contact regions; forming an electrode layer on the pair of contact regions and on the second insulating film; and patterning the electrode layer to form a source electrode, a drain electrode and a gate electrode.

In a manufacturing method according to the invention as defined above, a mixture gas of $O_2$/Ar may be used for the oxidative-gas-containing atmosphere and the mixture ratio is preferably not less than 10 vol %. Also in a manufacturing method according to the invention as defined above, the amorphous oxide may be an oxide containing at least one of In, Zn and Sn or contains In, Zn and Ga. Also in a manufacturing method according to the invention as defined above, the second insulating film may be an amorphous oxide insulator containing oxygen atoms such that the level of $O_2^+$ observed as desorbed gas by means of temperature programmed desorption mass spectrometry (TPD) is not less than $3.8 \times 10^{19}$/$cm^3$.

In still another aspect of the present invention, there is provided a thin film transistor manufactured by a manufacturing method as defined above.

In still another aspect of the present invention, there is provided a display device comprising a thin film transistor as defined above, wherein the source or drain of the thin film transistor is connected to an electrode of a display device. A display device according to the invention as defined above may be an electroluminescent device. A display device according to the invention as defined above may be a liquid crystal cell. A display device according to the invention as defined above may include a plurality of display devices and a plurality of thin film transistors as defined above are arranged two-dimensionally on a substrate.

Thus, in a thin film transistor using an oxide semiconductor according to the present invention, the electric resistance of a contact region of the oxide semiconductor layer to be held in contact with an electrode can be lowered and forming an ohmic contact with a source electrode or a drain electrode. Therefore, the present invention can provide a thin film transistor showing excellent transistor characteristics in terms of ohmic contact.

Further features of the present invention will become apparent from the following description of exemplary embodiments with reference to the attached drawings.

BEST MODE FOR CARRYING OUT THE INVENTION

Now, an exemplary embodiment of a thin film transistor according to the present invention will be described below by referring to the accompanying drawings.

Amorphous $SiO_x$ is employed as the gate insulating film material of this embodiment of thin film transistor. An $Al_2O_3$ channel and amorphous $SiO_xN_y$ can be formed by sputtering for the amorphous oxide insulator.

An oxide semiconductor containing ZnO or In, Zn and O can be used for the channel layer of the thin film transistor. An amorphous oxide containing In, Zn, O and additionally at least Ga, Al, Fe, Sn, Mg, Ca, Si or Ge and showing an electric conductivity of not less than $10^3$ S/cm and not more than $10^7$ S/cm can be used for the channel layer.

Figure 1:
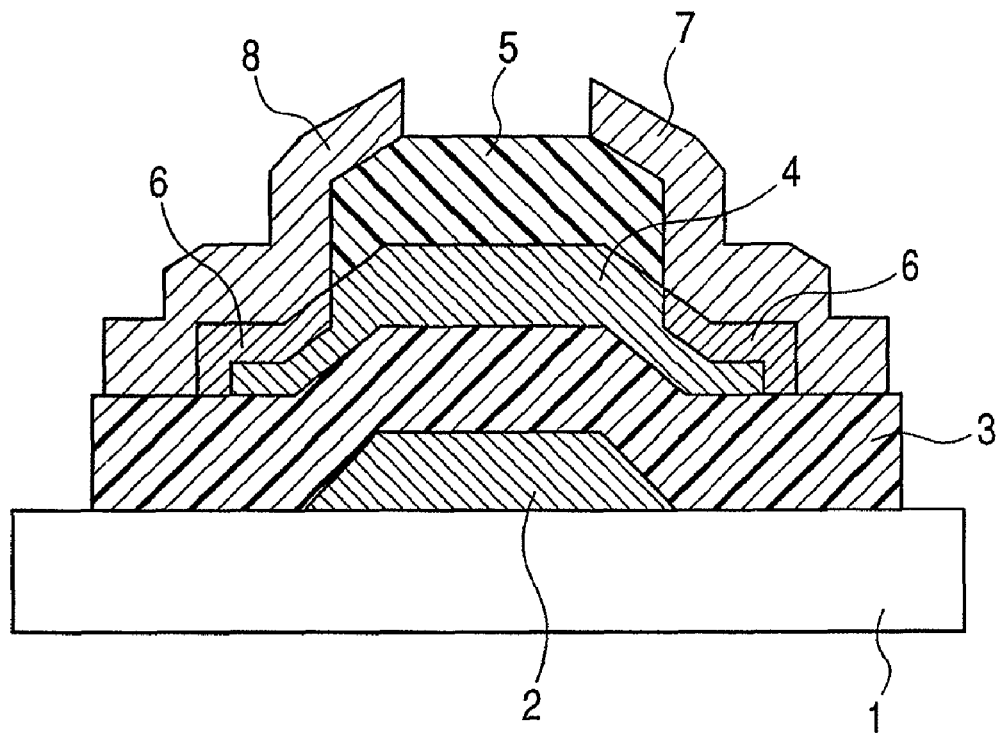
FIG. 1 is a schematic illustration of a reverse staggered type thin film transistor where the electric resistance of the contact regions of the oxide semiconductor layer and the electrodes is lowered, illustrating the structure thereof.

FIG. 1 is a schematic illustration of a first exemplary thin film transistor which is the bottom gate type where the electric resistance of the contact regions of the oxide semiconductor layer and the electrodes is lowered and the source electrode and the drain electrode are connected to the respective contact regions, illustrating the structure thereof. As seen from FIG. 1, a gate electrode 2 is formed on a substrate 1 and a first insulating film 3, an oxide semiconductor layer 4, a second insulating film 5, contact regions 6 of the oxide semiconductor layer and electrodes and a source electrode 7 and a drain electrode 8 are sequentially laid thereon.

FIGS. 13A, 13B, 13C, 13D, 13E, 13F, 13G and 13H are schematic cross sectional views of the thin film transistor of the first example in different manufacturing steps. Now, the process of manufacturing the device will be described below by referring to FIGS. 13A through 13H.

Figure 13A:
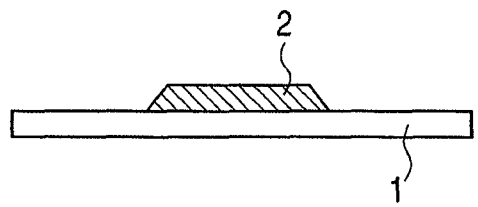
FIGS. 13A, 13B, 13C, 13D, 13E, 13F, 13G and 13H are schematic cross sectional views of a reverse staggered type thin film transistor device, in which the electric resistance of the contact regions of the oxide semiconductor layer and the electrodes is lowered, in different manufacturing steps.
Figure 13B:
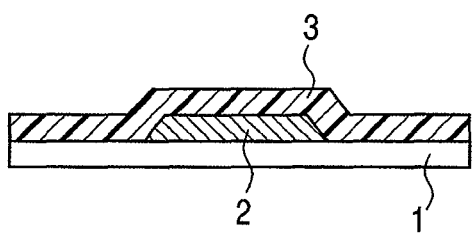
Figure 13C:
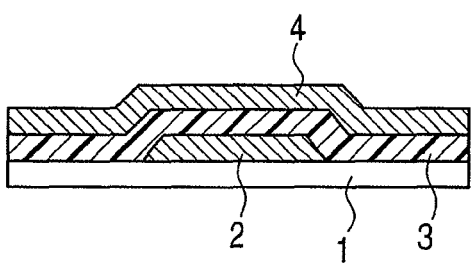

FIG. 13A illustrates the step of forming a gate electrode 2 on a substrate 1. FIG. 13B illustrates the step of forming a first insulating film 3 on the gate electrode 2. FIG. 13C illustrates the step of forming an oxide semiconductor layer 4 on the first insulating film 3. The oxide semiconductor layer 4 can be prepared at room temperature when an amorphous oxide containing In, Zn and O is used for it. Then, all the film forming steps can be conducted at room temperature if sputtering is employed for the insulating films. A plastic substrate or a plastic film can be used for the substrate 1.

Figure 13D:
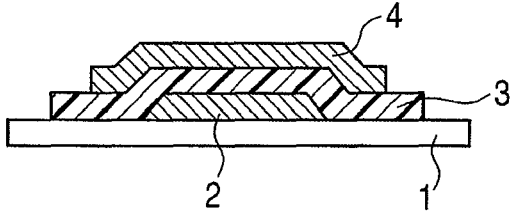

FIG. 13D illustrates the step of patterning the first insulating film 3 and the oxide semiconductor layer 4.

Figure 13E:
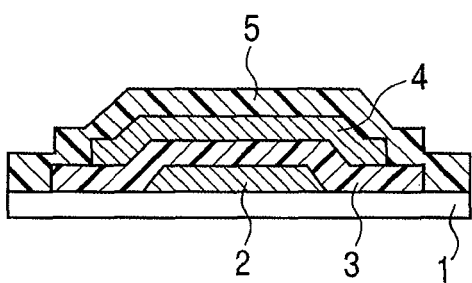

FIG. 13E illustrates the step of forming a second insulating film 5, which characterizes the present invention, on the oxide semiconductor layer 4. The second insulating film 5 is an amorphous oxide insulating layer that is formed in an oxidative-gas-containing atmosphere. Generation of oxygen defects in the oxide semiconductor containing ZnO as principal ingredient can be suppressed and also generation of large number of carrier electrons that increase the OFF current can be prevented from taking place by so forming the second insulating film 5, which operates as protective layer, as not to lower the electric resistance of the oxide semiconductor.

Figure 13F:
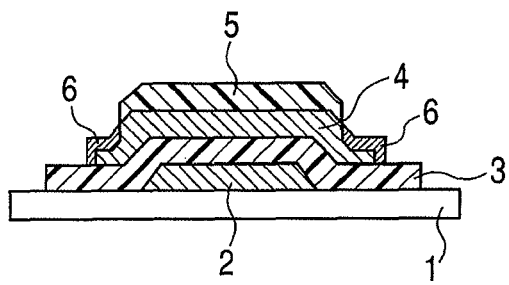

FIG. 13F illustrates the step of dry etching the second insulating film 5 by means of Ar-containing $CF_4$ gas and patterning the second insulating film 5 so as to cover the oxide semiconductor layer except the channel regions. In this etching step, the oxide semiconductor layer that is held in contact with the second insulating film, which is being subjected to the etching operation, is damaged by Ar ions to lower its electric resistance due to generation of oxygen defects because the etching gas contains Ar gas in addition to $CF_4$ gas. Therefore, the electric resistance of the oxide semiconductor layer that is affected by the etching is lowered to produce contact regions 6 that provide a good ohmic contact with the respective electrodes. Examples of etching gas that can be used for this step include the following in addition to $CF_4$. Namely, they include etching gases that are generally employed for dry etching of $SiO_2$ such as $SF_6$, $C_4F_8$, $CHF_3$, $Cl_2$, $BCl_3$, $CCl_2F_2$ and $CCl_4$. Any of mixture gases prepared by combining those etching gases and inert gases (He, Ne, Ar, Kr, Xe, $N_2$) can also be used for the purpose of the present invention. The advantages of the present invention can also be obtained by using a mixture gas prepared by combining an etching gas containing any of the above listed inert gases and oxygen added to a minute content ratio if the etching conditions including the power supply for plasma occurrence are regulated appropriately.

Figure 13G:
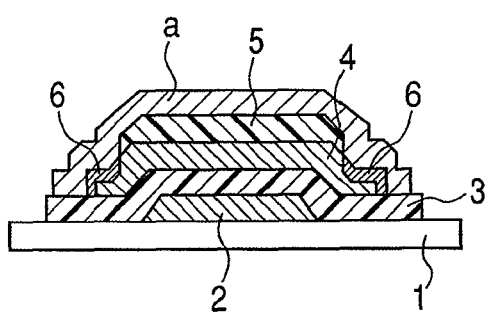
Figure 13H:
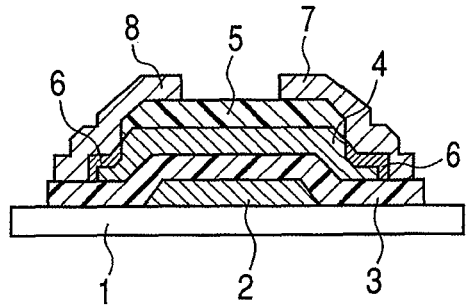

FIG. 13G illustrates the step of forming an electrode layer a for producing a source electrode and a drain electrode in the contact regions 6 of the oxide semiconductor layer and FIG. 13H illustrates the step of forming a source electrode 7 and a drain electrode 8 by patterning. A transparent conductive oxide film of Indium Tin Oxide (ITO) or Indium Zinc Oxide (IZO) is employed for the electrodes. Since the second insulating film 5 protects the channel regions, the source electrode and the drain electrode can be formed by patterning using dry etching or wet etching. A metal selected from Ni, Cr, Rh, Mo, Nd, Ti, W, Ta, Pb and Al, an alloy containing any of them or a silicide of any of them may be used for the source electrode and the drain electrode.

Figure 14:
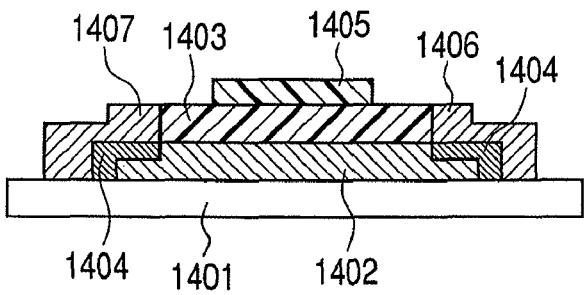
FIG. 14 is a schematic illustration of a top gate type thin film transistor where the electric resistance of the contact regions of the oxide semiconductor layer and the electrodes is lowered, illustrating the structure thereof.

FIG. 14 is a schematic illustration of a second exemplary thin film transistor which is the top gate type where the electric resistance of the contact regions of the oxide semiconductor layer and the electrodes is lowered and the source electrode and the drain electrode are connected to the respective contact regions, illustrating the structure thereof. As seen from FIG. 14, an oxide semiconductor layer 1402, a second insulating film 1403, contact regions 1404 of the oxide semiconductor layer and electrodes and a gate electrode 1405, a source electrode 1406 and a drain electrode 1407 are sequentially formed on a substrate 1401.

FIGS. 15A, 15B, 15C, 15D, 15E and 15F are schematic cross sectional views of the thin film transistor of the second example in different manufacturing steps. Now, the process of manufacturing the device will be described below by referring to FIGS. 15A through 15F.

Figure 15A:
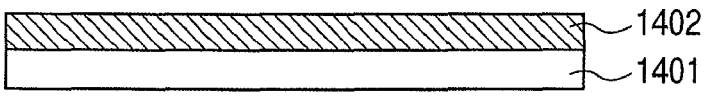
FIGS. 15A, 15B, 15C, 15D, 15E and 15F are schematic cross sectional views of a top gate type thin film transistor device, in which the electric resistance of the contact regions of the oxide semiconductor layer and the electrodes is lowered, in different manufacturing steps.

FIG. 15A illustrates the step of forming an oxide semiconductor layer 1402 on a substrate 1401. The oxide semiconductor layer 1402 can be prepared at room temperature when an amorphous oxide containing In, Zn and O is used for it. Then, all the film forming steps can be conducted at room temperature if sputtering is employed for the insulating films. A plastic substrate or a plastic film can be used for the substrate 1401.

Figure 15B:
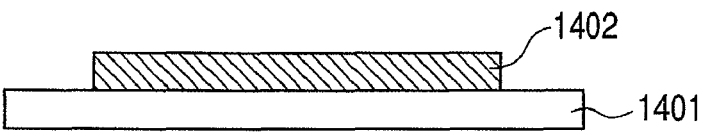
Figure 15C:
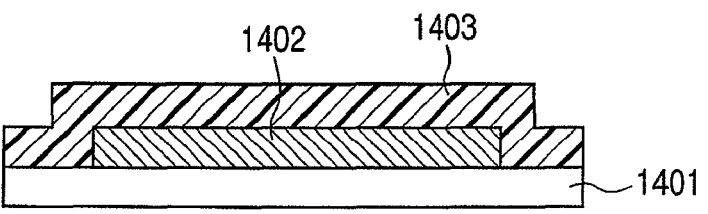

FIGS. 15B and 15C respectively illustrate the step of patterning the oxide semiconductor layer 1402 and the step of forming a second insulating film 1403 that is made to become a gate insulating film on the oxide semiconductor layer 1402. Like the second insulating film 5 of the above described first example, the second insulating film 1403 is an amorphous oxide insulating layer that is formed in an oxidative-gas-containing atmosphere. Generation of oxygen defects in the oxide semiconductor containing ZnO as principal ingredient can be suppressed and also generation of large number of carrier electrons that increase the OFF current can be prevented from taking place by so forming the second insulating film 1403 as not to lower the electric resistance of the oxide semiconductor.

Figure 15D:
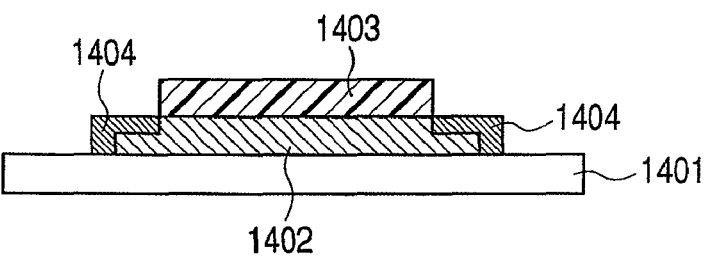

FIG. 15D illustrates the step of patterning the second insulating film 1403. The second insulating film 1403 is subjected to a dry etching operation employing Ar-containing $CF_4$ gas and then patterned so as to cover the oxide semiconductor layer except the channel regions. In this etching step, the oxide semiconductor layer that is held in contact with the second insulating film 1403, which is being subjected to the etching operation, is damaged by Ar ions to lower its electric resistance due to generation of oxygen defects because the etching gas contains Ar gas in addition to $CF_4$ gas. Therefore, the electric resistance of the oxide semiconductor layer that is affected by the etching is lowered to produce contact regions 1404 that provide a good ohmic contact with the respective electrodes.

Figure 15E:
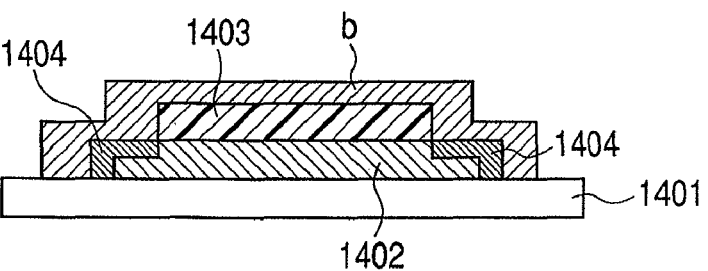
Figure 15F:
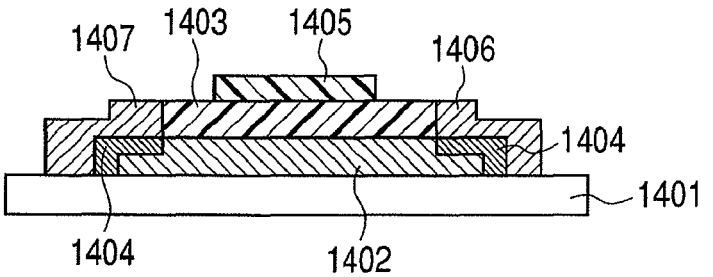

FIG. 15E illustrates the step of forming an electrode layer b for producing a source electrode, a drain electrode and a gate electrode in the contact regions 1404 of the oxide semiconductor layer and on the second insulating film 1403. FIG. 15F illustrates the step of forming a gate electrode 1405, a source electrode 1406 and a drain electrode 1407 by patterning. A transparent conductive oxide film of ITO or IZO is employed for the electrodes. Since the second insulating film 1403 protects the channel regions, the source electrode and the drain electrode can be formed by patterning using dry etching or wet etching. A metal selected from Ni, Cr, Rh, Mo, Nd, Ti, W, Ta, Pb and Al, an alloy containing any of them or a silicide of any of them may be used for the source electrode and the drain electrode.

Now, a thin film transistor of which the second insulating film is formed in an atmosphere not containing any oxidative gas will be described below for the purpose of comparison.

Figure 2:
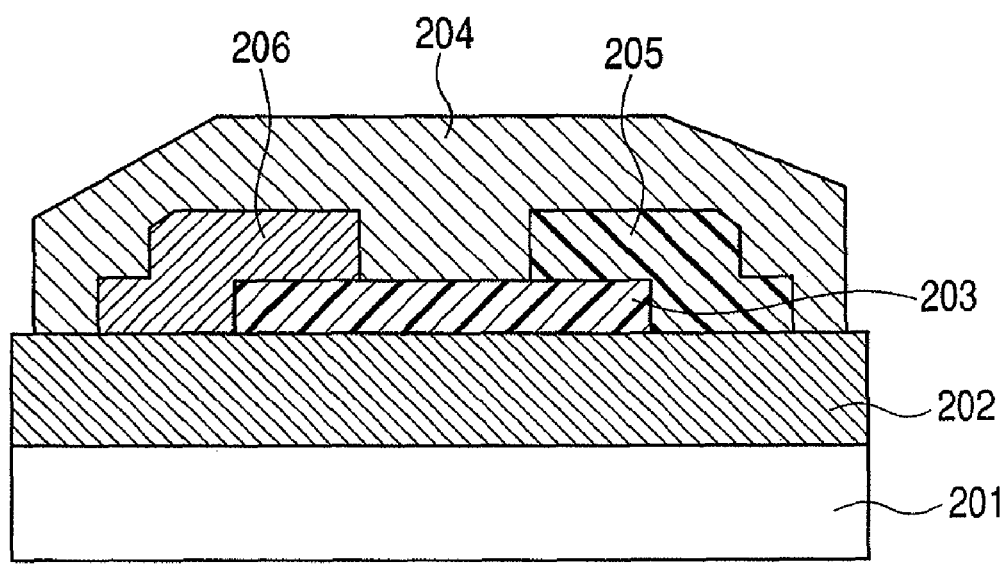
FIG. 2 is a schematic illustration of a reverse staggered type thin film transistor using a thermal oxide film silicon gate insulating film on a low resistance n-type silicon substrate, illustrating the structure thereof.
Figure 3:
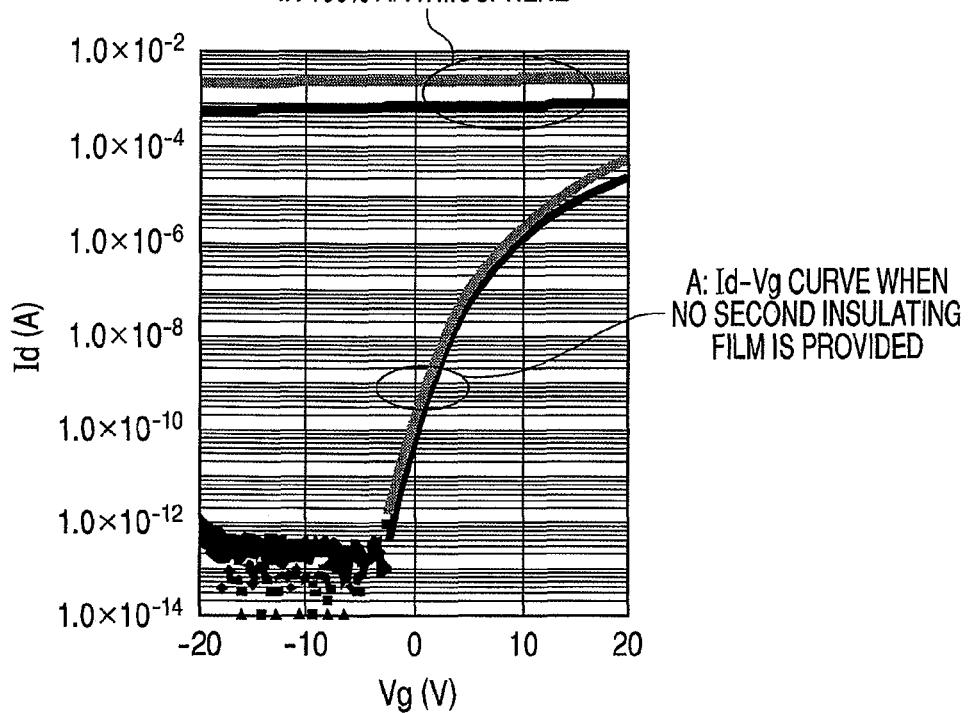
FIG. 3 is a graph illustrating a current-voltage characteristic that can typically be obtained when a reverse staggered type thin film transistor as illustrated in FIG. 2 is prepared.

FIG. 2 is a schematic illustration of a bottom gate reverse staggered type thin film transistor using a thermal oxide film silicon gate insulating film 202 on substrate 201 that is a low resistance n-type silicon substrate also operating as gate electrode, illustrating the structure thereof. The influence of the conditions for forming the second insulating film 204 on the characteristics of thin film transistor was studied by using the structure of FIG. 2. Firstly, amorphous InGaZnO was formed as oxide semiconductor layer 203 and a source electrode 205 and a drain electrode 206 were formed by depositing a stacked structure of Ti/Au/Ti by means of evaporation and then by employing a lift-off method. A thin film transistor: A was completed without using any second insulating layer. Subsequently, a second insulating film of amorphous $SiO_x$ was formed to a thickness of 100 nm by sputtering, using Ar 100 vol % gas. Thus, a thin film transistor: B having a second insulating film was completed by forming contact holes on the source electrode 205 and the drain electrode 206 by means of wet etching. FIG. 3 is a graph illustrating a typical current-voltage characteristic of a thin film transistor: A and that of a thin film transistor: B prepared by way of the above described process. The thin film transistor A showed a characteristic of a good ON/OFF ratio and a minimized OFF current. However, the thin film transistor B having a second insulating film of amorphous $SiO_x$, which may be regarded as an ordinary oxide insulating film, did not illustrate any OFF current when the gate voltage was −20 V. It may be safe to assume that the reason for this is that the oxide semiconductor layer was reduced or oxygen defects were generated in the step of forming the second insulating film. Oxygen defects can be produced and a large number of carrier electrons can be generated with ease in an oxide semiconductor containing ZnO as principal ingredient. While FIG. 3 illustrates the results obtained by using sputtering for forming the second insulating film, the ON/OFF ratio can be worsened when the second insulating film is formed by P-CVD, using amorphous $SiO_x$ or amorphous $SiN_y$. As a matter of fact, a thin film transistor did not operate at all as such. Oxide semiconductors are very sensitive to hydrogen and the inventors of the present invention believe that the reason for this is that the electric resistance of the part of the oxide semiconductor held in contact with the second insulating film was lowered.

Now, the advantages of the second insulating film formed in a oxidative-gas-containing atmosphere that characterizes the present invention will be discussed in detail below.

(On the Second Insulating Film)

Specifically, a second insulating film can be realized by forming an amorphous oxide insulating layer by means of sputtering, using $SiO_x$ as target and a mixture gas of $O_2$ gas and Ar gas (to be referred to as $O_2$/Ar mixture gas hereinafter) as sputtering gas.

The mixing ratio of $O_2$/Ar is expressed by [$O_2$ gas flow rate (SCCM)/[$O_2$ gas flow rate (SCCM)]+[Ar gas flow rate (SCCM)]unit: vol %. The effect that the oxide semiconductor layer is not reduced and that no oxygen defects are generated can be realized by forming an amorphous oxide insulating layer, using an $O_2$/Ar mixture gas as sputtering gas. The effect is observed when the $O_2$/Ar mixture gas takes 10 vol % or more, preferably takes 50 vol %. A thin film transistor having a second insulating film of an amorphous oxide insulating layer showed a good OFF current characteristic under any oxide semiconductor conditions where a thin film transistor having no second insulating film shows a good OFF current characteristic when the $O_2$/Ar mixture gas takes the ratio of 50 vol %.

Temperature programmed desorption mass spectrometry (TPD) can be used to gauge the oxygen content of the amorphous $SiO_x$ of the second insulating film. A oxygen desorption peak of the oxygen contained in a thin film can be observed in a temperature range between tens of several 10° C. and about 400° C. of the thermocouple held in contact with the surface of the substrate carrying the thin film, although the temperature range may vary depending on the specimen.

TPD showed that the oxygen that could be desorbed from the amorphous $SiO_x$ of the second insulating film of a thin film transistor manufactured by a method according to the present invention had been completely desorbed when the temperature was raised to about 400° C. The temperature range used for the quantification was between 50° C. and 800° C. as observed at the thermocouple held in contact with the surface of the substrate.

Figure 4:
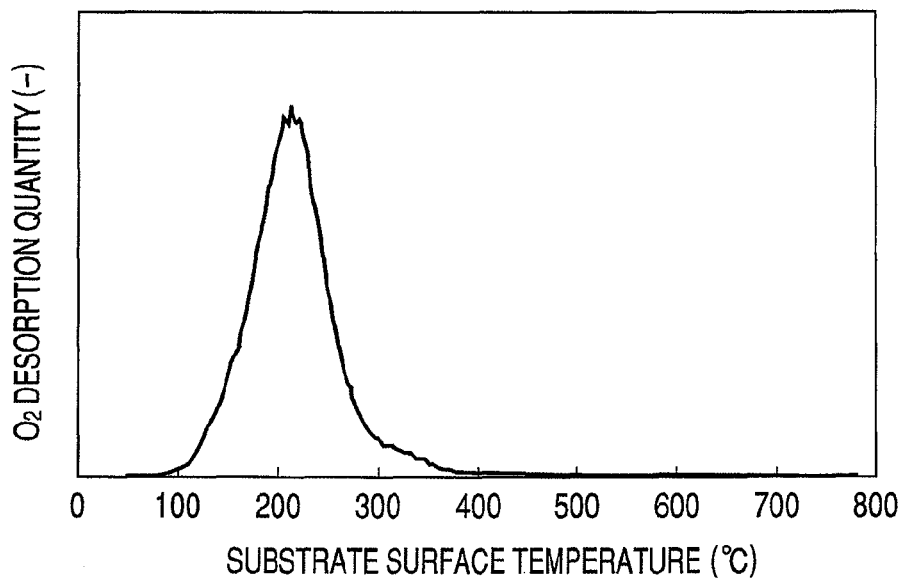
FIG. 4 is an example of oxygen desorption spectrum of the second insulating layer observed by temperature programmed desorption mass spectrometry.
Figure 5:
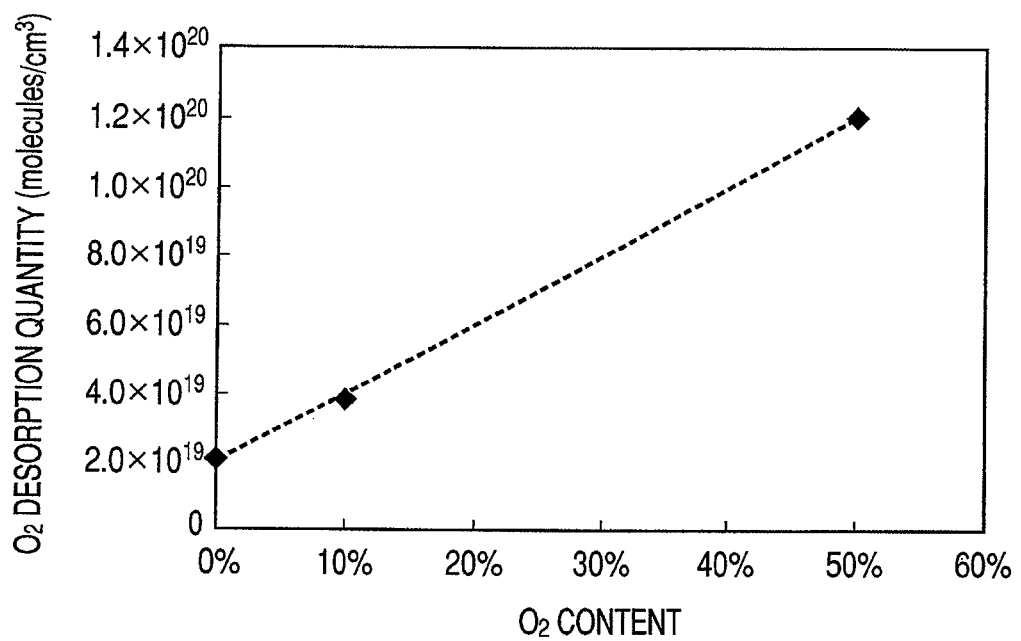
FIG. 5 is a graph illustrating the relationship between the quantity of oxygen desorbed from amorphous $SiO_x$ as observed by temperature programmed desorption mass spectrometry and the O2 gas concentration contained in Ar of the forming atmosphere.

The desorbed gas was identified as oxygen by the ion intensity of the mass number (m/z) 32 that corresponds to $O_2^+$. FIG. 4 is an example of oxygen desorption spectrum of the second insulating layer observed by TPD. The quantity of oxygen desorbed from the amorphous $SiO_x$ of the second insulating film was proportional to the oxygen concentration in the forming atmosphere. FIG. 5 is a graph illustrating the relationship between the quantity of oxygen desorbed from amorphous $SiO_x$ as observed by TPD and the $O_2$ gas concentration contained in Ar of the forming atmosphere.

The inventors of the present invention paid intensive efforts for research and development of thin film transistors using a transparent oxide semiconductor and found that an $O_2$/Ar mixture gas can suitably be used as sputtering gas for forming an amorphous $SiO_x$ film and that generation of oxygen defects of the oxide semiconductor is suppressed and also generation of large number of carrier electrons that increase the OFF current can be prevented from taking place when the mixture ratio is not less than 10 vol %.

It was also found that the amorphous $SiO_x$ film contained oxygen atoms such that the level of $O_2^+$ observed as desorbed gas by means of TPD was not less than $3.8 \times 10^{19}/cm^3$, although the oxygen content can vary depending on film forming conditions, hence showing an effect of suppressing generation of oxygen defects.

Additionally, it was found that the film forming conditions that provide a wide process margin include that the $O_2$/Ar mixing ratio of sputtering gas for forming a film is 50 vol % and the formed film contains oxygen atoms such that the level of $O_2^+$ observed as desorbed gas by means of TPD is $1.2 \times 10^{20}/cm^3$ when the mixing ratio is held to the above level.

According to the findings of the inventors of the present invention, there is no upper limit for the $O_2$/Ar mixing ratio of sputtering gas for forming a film in the film forming conditions for forming amorphous $SiO_x$ showing an effect of suppressing generation of oxygen defects. In other words, the effect can be observed when $O_2$ content is 100 vol %. However, since the film forming rate falls as the $O_2$/Ar mixing ratio rises, an $O_2$/Ar mixing ratio of not less than about 50 vol % can optimally be used for sputtering gas for forming an amorphous $SiO_x$ film. While the relationship between the $O_2$/Ar mixing ratio of sputtering gas for forming an amorphous $SiO_x$ film and the film forming rate depends on the film forming parameters such as the film forming gas pressure and the distance between the substrate and the target, it is very sensitive to the oxygen partial pressure. Therefore, film forming conditions including a high oxygen partial pressure are not normally employed. When the film forming rate at an $O_2$/Ar mixing ratio of 0 vol % is used as reference (100%) under the above film forming conditions, the film forming rate is 77% and 39% respectively at $O_2$/Ar mixing ratios of 10 vol % and 50 vol %.

Figure 9:
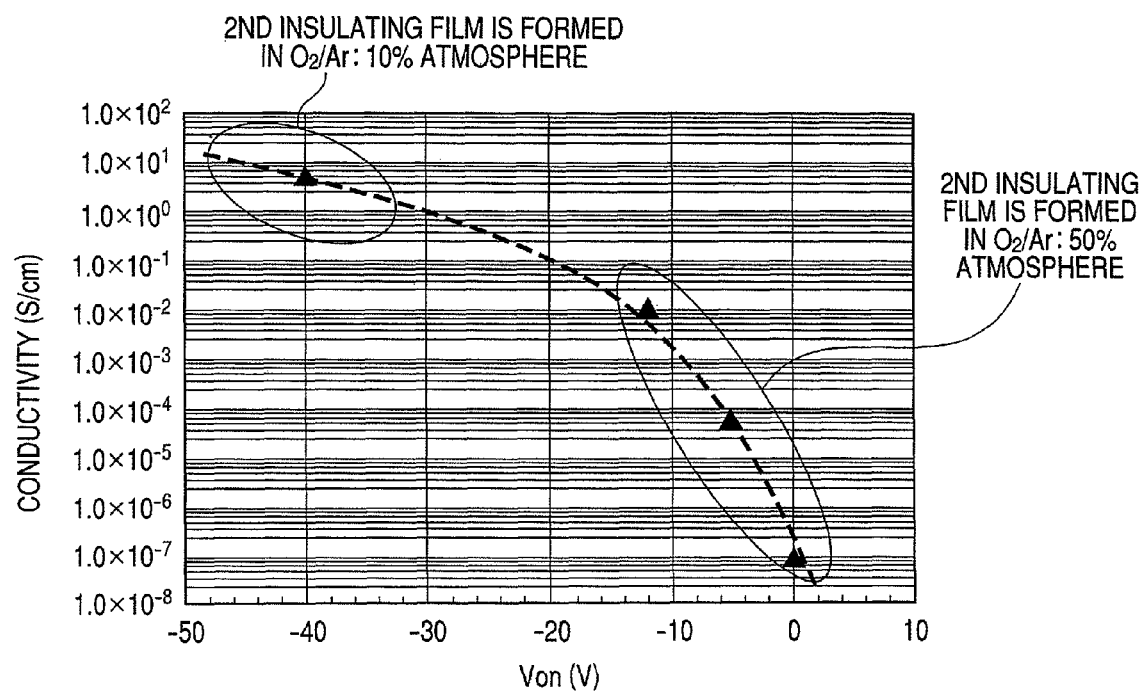
FIG. 9 is a graph illustrating the relationship between Von and the electric conductivity of the oxide semiconductor of a reverse staggered (bottom gate) type MISFET device.
Figure 11:
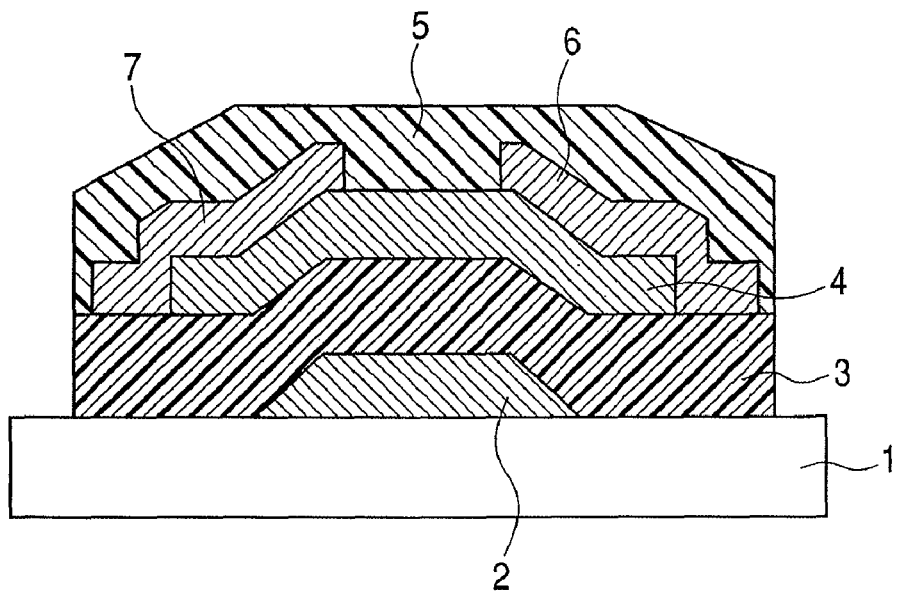
FIG. 11 is a schematic illustration of a reverse staggered type thin film transistor having a protective film, illustrating the structure thereof.

A thin film transistor having a structure as shown in FIG. 11 was prepared by using a second insulating film of amorphous $SiO_x$ and forming amorphous InGaZnO as oxide semiconductor under the same conditions. At the same time, a TEG (test element group) device for gauging the oxide semiconductor electric conductivity was prepared under the same process conditions and the electric conductivity of the oxide semiconductor layer was observed. FIG. 9 is a graph illustrating the relationship between Von and the electric conductivity of the oxide semiconductor. In FIG. 9, Von denotes the voltage applied to the gate when the drain current (Id) rises with the transfer characteristic of the thin film transistor. The electric conductivity of the oxide semiconductor is strongly related to Von, which is shifted to the negative side as the electric conductivity of the oxide semiconductor is raised and becomes no longer visible if the voltage is not higher than −40 V when the electric conductivity is raised further. Thus, it is clear from the graph of FIG. 9 that, as the electric conductivity of the oxide semiconductor is raised in the process of forming the second insulating film, Von that indicates the boundary of the OFF current and the ON current is shifted to the negative side and worsened. Then, as a result, the OFF current characteristic is also worsened. The increase of the electric conductivity of the oxide semiconductor is suppressed by the conditions for forming the second insulating film. The suppressing effect is observed when the $O_2$/Ar mixing ratio is not less than 10 vol %, when the film contains oxygen atoms such that the level of $O_2^+$ observed as desorbed gas by means of TPD is not less than $3.8 \times 10^{19}/cm^3$.

Figure 10:
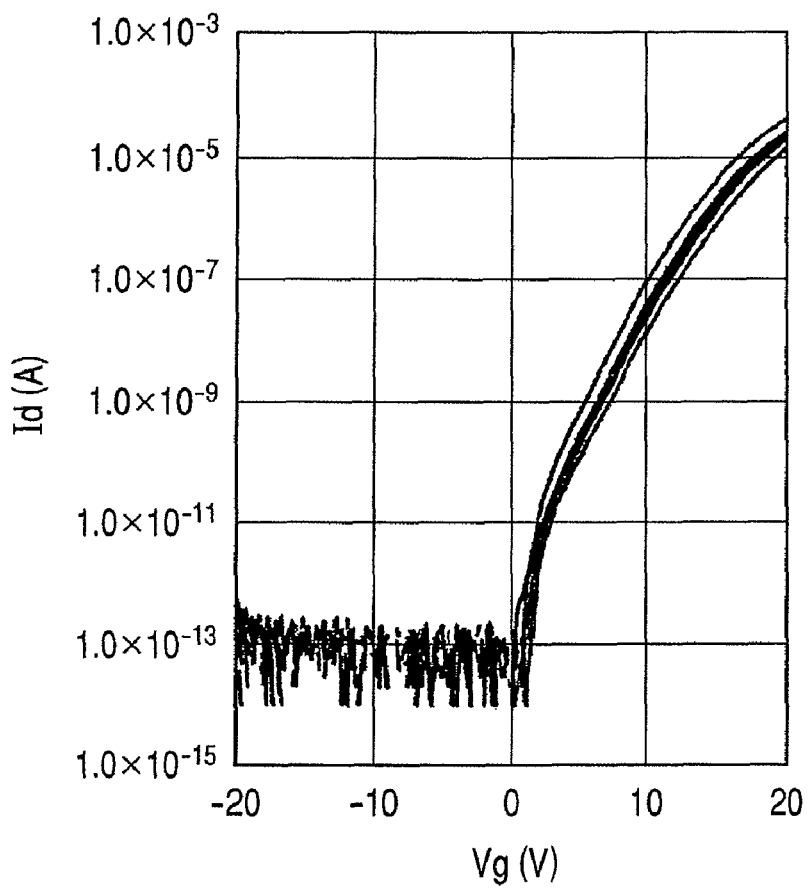
FIG. 10 is a graph illustrating the transfer characteristics obtained by preparing nine thin film transistors, each having the structure of FIG. 2, and observing the thin film transistor characteristics thereof.

A total of nine thin film transistors having a structure as shown in FIG. 2 were prepared by using amorphous $SiO_x$ formed by means of sputtering gas with an $O_2$/Ar mixing ratio of 50 vol % and containing oxygen atoms by $1.2 \times 10^{20}/cm^3$ for the second insulating film and the thin film transistor characteristics of the nine thin film transistors was observed. FIG. 10 is a graph illustrating the transfer characteristics of the nine thin film transistors. As seen from FIG. 10, Von was controlled so as to be substantially equal to 0V and thin film transistors showed a good ON/OFF ratio.

While amorphous $SiO_x$ is employed for the second insulating film in the above description, amorphous oxynitride or amorphous alumina can alternatively be used as amorphous oxide insulator for the second insulating film. Additionally, while an $O_2$/Ar mixture gas is employed as oxidative gas for forming the second insulating film in the above description, oxidative gas is not limited to oxygen gas because what is essential for the present invention is to form a second insulating film so as not to raise the electric conductivity of the oxide semiconductor.

For instance, an amorphous oxide semiconductor layer containing indium, gallium and zinc to a composition ratio of 1:1:1 (a-IGZO thin film) is formed for a thin film transistor by sputtering that can produce a film of a large area. Then, the amorphous oxide semiconductor layer is applied to a thin film transistor to make the latter show a structure as illustrated in FIG. 1. By doing so, the ON/OFF ratio of the transistor can be made not less than $10^5$. Then, the field effect mobility shows a value not less than 1 $cm^2V^{-1}s^{-1}$.

The operation of patterning the second insulating film will be described below. As dry etching gas is made to contain Ar, the oxide semiconductor layer that is held in contact with the second insulating film, which is subjected to an etching operation, is damaged to generate oxygen defects so that its electric resistance is lowered. It may be safe to assume that the mechanism of lowering the electric resistance is same as the one that works when amorphous $SiO_x$ is formed for the second insulating film in an atmosphere of Ar 100 vol %.

Because of the above-described effect, channel regions that can stably minimize the OFF current are formed in a bottom gate type thin film transistor using an oxide semiconductor and additionally a thin film transistor, in which the electric resistance of the contact regions of the oxide semiconductor and the electrodes is lowered, can be obtained. Then, as a result, a thin film transistor showing a good ohmic contact between the source electrode and the drain electrode and the oxide semiconductor layer can be obtained. Thus, a thin film transistor showing a minimized OFF current and excellent transistor characteristics can be obtained.

A transparent conductive oxide semiconductor polycrystalline thin film formed by using ZnO as principal ingredient or a transparent conductive oxide semiconductor thin film containing microcrystal and formed by using ZnO is employed for the semiconductor layer (channel layer) in the above description. Additionally, an instance of using an amorphous oxide containing In—Ga—Zn—O is also described above. However, the materials that can be used for the oxide semiconductor layer are not limited to the above-described ones.

An amorphous oxide containing at least an element selected from Sn, In and Zn can be used for the amorphous oxide semiconductor layer that contains In—Ga—Zn—O.

When Sn is selected at least as part of the elements constituting such an amorphous oxide, Sn can be replaced by $Sn_{1-x}M4_x$ (0<x<1, M4 is selected from Si, Ge and Zr that are Group IV elements having an atomic number smaller than Sn).

When In is selected at least as part of the elements constituting such an amorphous oxide, In can be replaced by $In_{1-y}M3_y$ (0<y<1, M3 is selected from B, Al, Ga and Y that are Group III elements having an atomic number smaller than In or Lu).

When Zn is selected at least as part of the elements constituting such an amorphous oxide, Zn can be replaced by $Zn_{1-z}M2_z$ (0<z<1, M2 is selected from Mg and Ca that are Group II elements having an atomic number smaller than Zn).

More specifically, examples of amorphous materials that can be used for this embodiment include Sn—In—Zn oxides, In—Zn—Ga—Mg oxides, In oxides, In—Sn oxides, In—Ga oxides, In—Zn oxides, Zn—Ga oxides and Sn—In—Zn oxides. Of course, the composition ratio of the composing materials is not necessarily be 1:1. While it may be difficult for Zn and Sn to become amorphous alone, an amorphous phase can be formed with ease for both of them when In is contained. In the case of the In—Zn type, the composition can be made to contain In by not less than about 20 atom % for the ratio of the numbers of atoms where oxygen is excepted. In the case of the Sn—In type, the composition can be made to contain In by not less than about 80 atom % for the ratio of the numbers of atoms where oxygen is excepted. In the case of the Sn—In—Zn type, the composition can be made to contain In by not less than about 15 atom % for the ratio of the numbers of atoms where oxygen is excepted.

That a specimen of thin film is amorphous can be confirmed by not detecting any clear diffraction peak (and hence a halo pattern is observed) when the specimen is subjected to X-ray diffraction analysis using a low angle of incidence of about 0.5 degrees. When any of the above-described materials is used for the channel layer of a field effect type transistor, this embodiment does not exclude that the channel layer contains such a material in the state of microcrystal.

A display apparatus can be formed by connecting the drain, which operates as output terminal, of a thin film transistor to a display device such as an organic or inorganic electroluminescent (EL) device or a liquid crystal device. Now, a specific exemplary structure of a display apparatus will be described by referring to a cross sectional view thereof.

Figure 6:
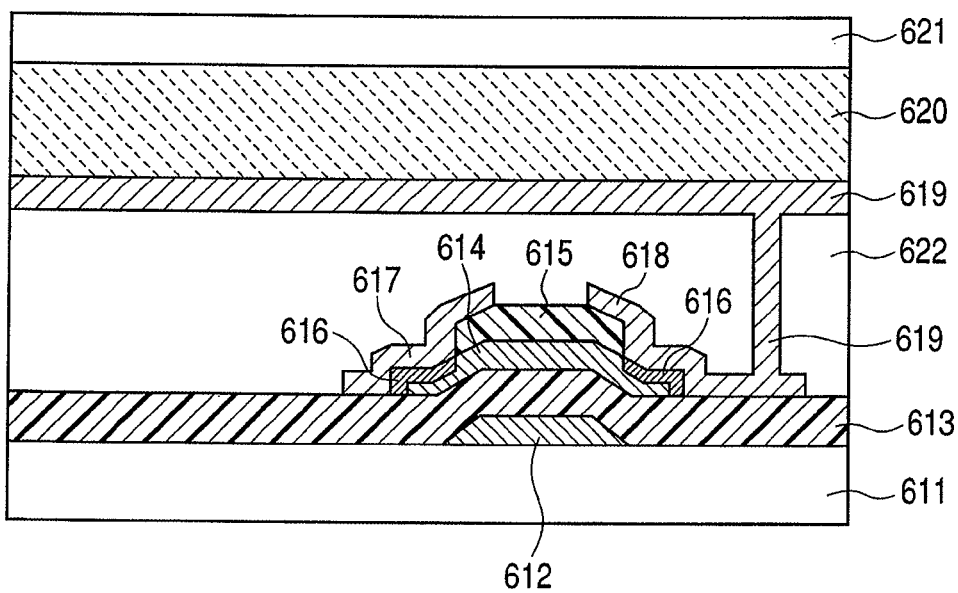
FIG. 6 is a schematic cross sectional view of an exemplary display apparatus according to the present invention.

For example, a thin film transistor having a structure as shown in FIG. 6 is formed. The thin film transistor includes a gate electrode 612, a gate insulating layer 613, an oxide semiconductor layer 614, a second insulating film 615, contact regions 616 of the oxide semiconductor layer and the electrodes, a source (drain) electrode 617 and a drain (source) electrode 618 that are sequentially formed on a base member 611. Another electrode 619 is connected to the drain (source) electrode 618 by way of an interlayer insulating film 622 and held in contact with a light emitting layer 620. Further, the light emitting layer 620 contacts the gate electrode 612. With the above described arrangement, the electric current injected into the light emitting layer 620 can be controlled by means of the current value of the electric current flowing from the source (drain) electrode 617 to the drain (source) electrode 618 by way of the channel formed in the oxide semiconductor layer 614 and hence by means of the voltage of the gate 612 of the thin film transistor. Note that the electrode 619, the light emitting layer 620 and the electrode 621 form an inorganic or organic electroluminescent device.

Figure 7:
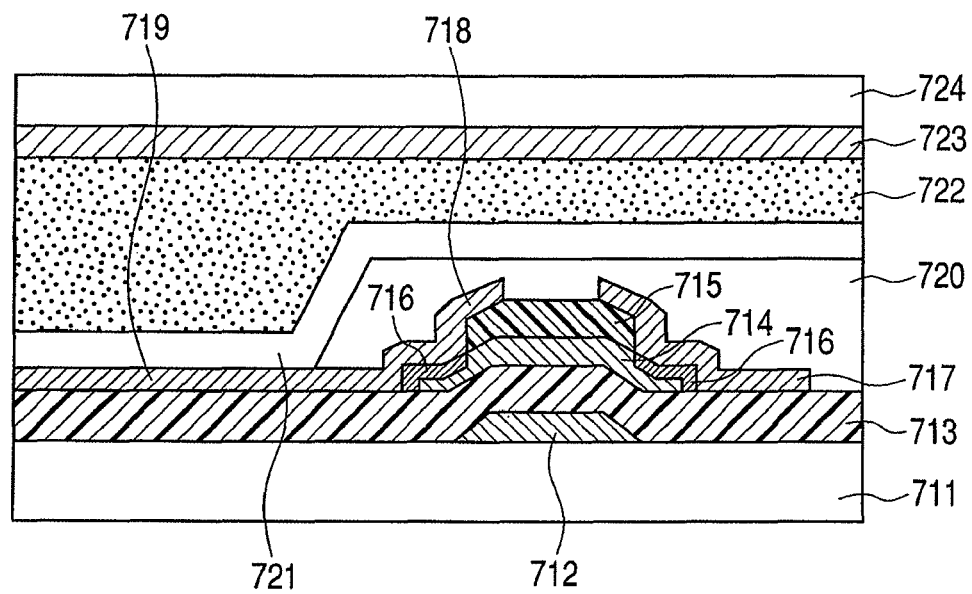
FIG. 7 is a schematic cross sectional view of another exemplary display apparatus according to the present invention.

When the drain (source) electrode 718 is extended to operate also as electrode 719 as shown in FIG. 7, it may alternatively be so arranged that a voltage is applied to a liquid crystal cell or electrophoresis type particle cell 722 sandwiched between high resistance films 721 and 723 by the electrode 719 and the opposite electrode 724. Note that the liquid crystal cell or electrophoresis type particle cell 722, the high resistance layers 721 and 723, the electrode 719 and the electrode 724 form a display device. The first insulating film 713, the oxide semiconductor layer 714, the contact regions 716 of the source and drain electrodes and the second insulating film 715 are arranged as shown in FIG. 7. The voltage applied to the display device can be controlled by means of the current value of the electric current flowing from the source electrode 717 to the drain electrode 718 by way of the channel formed in the oxide semiconductor layer 714. Note that the high resistance films 721, 723 are not necessary when the display medium of the display device is a capsule formed by containing fluid and particles in an insulating film coat in a sealed condition.

While a bottom gate reverse staggered type thin film transistor is representatively described in each of the above described two examples of thin film transistor, the present invention is by no means limited thereto. For instance, the present invention is applicable to a coplanar type or some other type thin film transistor so long as the connection between the drain electrode, which is the output terminal of the thin film transistor, and the display device is topologically the same.

While the pair of electrodes for driving the display device is arranged in parallel with the base member in each of the above described two examples, the present invention is by no means limited thereto. For instance, either or both of the electrodes may be arranged perpendicular relative to the substrate so long as the connection between the drain electrode, which is the output terminal of the thin film transistor, and the display device is topologically the same.

While only a thin film transistor is shown and connected to a display device in each of the above-described two examples, the present invention is by no means limited thereto. For instance, the illustrated thin film transistor may be connected to another thin film transistor according to the present invention so long as the illustrated thin film transistor is arranged at the last stage of the circuit formed by those thin film transistors.

When the pair of electrodes for driving the display device is arranged in parallel with the base member and the display device is an EL device or a reflection type display device such as a reflection type liquid crystal device, either of the electrodes is required to be transparent relative to the emission wavelength or the wavelength of reflected light. When the display device is a transmission type display device such as a transmission type liquid crystal device, the both electrodes are required to be transparent relative to transmitted light.

All the components of a thin film transistor according to the present invention can be made transparent. Then, a transparent display device can be formed. Additionally, such a display device can be arranged on a low thermal resistance base member such as a lightweight, flexible and transparent plastic substrate.

Now, a display apparatus formed by two-dimensionally arranging a plurality of pixels, each having an EL device (an organic EL device here) and a thin film transistor will be described below by referring to FIG. 8.

Figure 8:
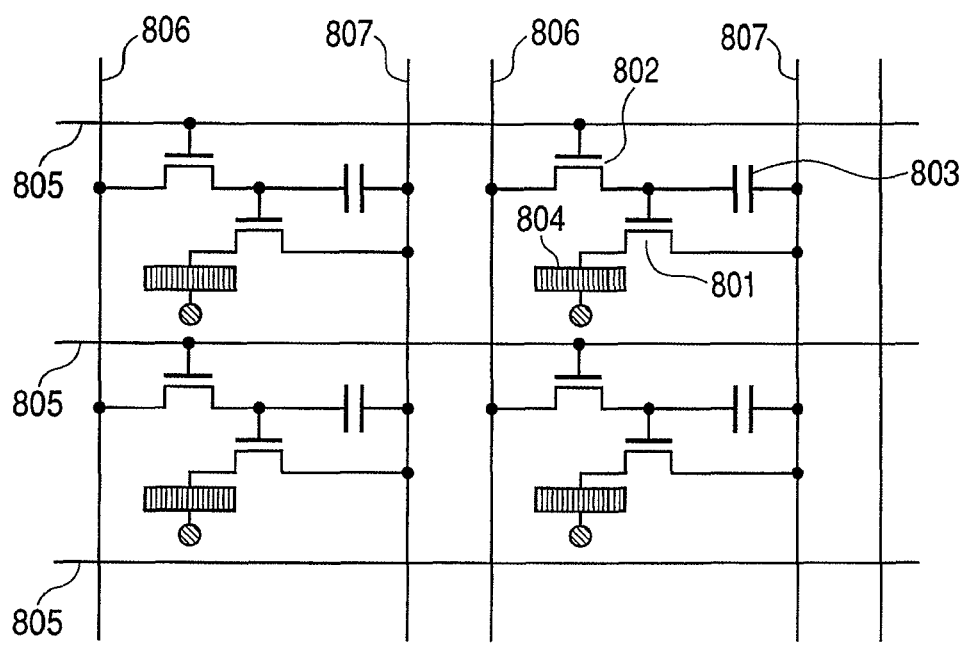
FIG. 8 is a circuit diagram of a display apparatus formed by arranging pixels, each including an organic EL device and a thin film transistor, two-dimensionally, illustrating the configuration thereof.

In FIG. 8, 801 denotes a transistor for driving an organic EL device 804 and 802 denotes a transistor for selecting the corresponding pixel. Capacitor 803 is adapted to hold the selected state. It stores an electric charge between the common electrode line 807 and the source part of the transistor 802 related to it and holds the signal of the gate of the transistor 801. A pixel is selected by means of the corresponding scanning electrode line 805 and the corresponding signal electrode line 806.

More specifically, a video signal is applied from a driver circuit (not shown) to the gate electrode by way of the scanning electrode line 805 as pulse signal. At the same time, a signal is applied from another drive circuit (not shown) to the transistor 802 by way of the signal electrode line 806 also as pulse signal to select the pixel. At this time, the transistor 802 is turned ON and an electric charge is stored in the capacitor 803 arranged between the common electrode line 807 and the source of the transistor 802. As a result, the gate voltage of the transistor 801 is held to a desired voltage level and the transistor 801 is turned ON. This state is held until the next signal is received. As long as the transistor 801 is in the ON state, the voltage and the electric current are continuously supplied to the organic EL layer 804 to maintain the emission of light.

While a pixel is formed by two transistors and a capacitor in the instance of FIG. 8, more transistors may be incorporated into a pixel in order to improve the performance thereof. What is essential here is that an effective EL device can be obtained by using an In—Ga—Zn—O based thin film, which is a transparent thin film transistor that can be formed at low temperature, for the transistor part of the pixel.

Now, the present invention will be described further by way of examples, although the examples do not limit the scope of the present invention by any means.

Example 1

Figure 12:
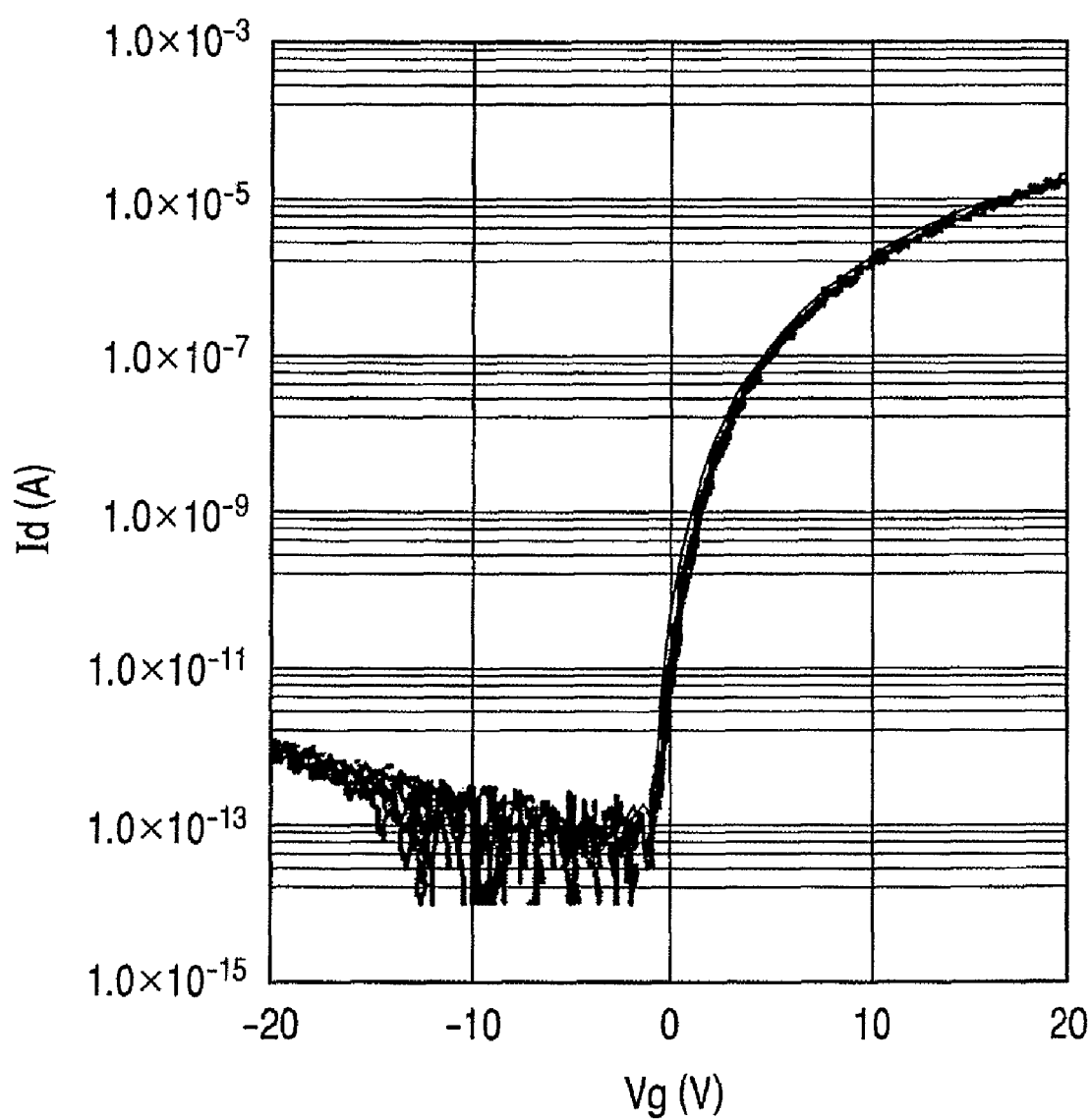
FIG. 12 is a graph illustrating the transfer characteristics obtained by preparing nine thin film transistors, each having the structure of FIG. 11, and observing the thin film transistor characteristics thereof.

In this example, reverse staggered (bottom gate) type MISFET devices were prepared. For each device, firstly a gate terminal of Ti5 nm/Au40 nm/Ti5 nm was prepared on a glass substrate by means of photolithography and a lift-off method. Then, an insulating layer of amorphous $SiO_x$ was formed to a thickness of 200 nm thereon by sputtering. At this time, an $SiO_2$ target was used as sputtering target and Ar gas was used as sputtering gas. The RF high frequency power and the film forming pressure were 400 W and 0.1 Pa respectively. The substrate temperature was room temperature and the substrate was not intentionally heated. Then, an amorphous oxide semiconductor film to be used as semiconductor layer was formed to a thickness of 20 nm by sputtering at room temperature. At this time, a polycrystalline $InGaZnO_4$ target was employed and an $O_2$/Ar gas with a mixing ratio of 5 vol % was used as sputtering gas. The RF high frequency power and the film forming pressure were 200 W and 0.1 Pa respectively. The substrate temperature was room temperature and the substrate was not intentionally heated. The channel regions were formed by means of photolithography and wet etching using hydrochloric acid. Subsequently, a film of Ti5 nm/Au100 nm/Ti5 nm was formed by means of electron beam deposition and source/drain terminals were formed by means of photolithography and a lift-off method. Additionally, an insulating layer of amorphous $SiO_x$ was formed to a thickness of 100 nm by sputtering as the second insulating film. At this time, an $SiO_2$ target was employed and an oxidative gas atmosphere containing $O_2$/Ar gas with a mixing ratio of 50 vol %, $O_2$ gas 5 SCCM and Ar gas 5 SCCM was used as sputtering gas. The substrate temperature was room temperature and the substrate was not intentionally heated. A total of nine reverse staggered (bottom gate) type MISFET devices were completed in this way. The metal composition ratio of the amorphous oxide semiconductor film was In:Ga:Zn=1.00:0.94:0.65. The I-V characteristic of the MISFET devices was evaluated to find that the nine thin film transistors showed an average field effect mobility of 5.0 $cm^2$/Vs and an average ON/OFF ratio of not less than $10^6$. FIG. 12 illustrates the transfer characteristics thereof.

Thus, thin film transistors showing good transistor characteristics can be prepared with a minimized OFF current on a stable basis by using a second insulating film according to the present invention.

Example 2

Reverse staggered (bottom gate) type MISFET devices as shown in FIG. 11 were prepared as in Example 1 except the conditions for forming the second insulating film.

For each device, an insulating layer of amorphous $SiO_x$ was formed to a thickness of 100 nm as the second insulating film by sputtering. An oxidative gas atmosphere containing $O_2$/Ar mixture gas with a mixing ratio of 10 vol % was used as sputtering gas. A total of nine reverse staggered (bottom gate) type MISFET devices as shown in FIG. 11 were completed in this way.

At the same time, a TEG device for gauging the oxide semiconductor electric conductivity was prepared under the same process conditions and the electric conductivity of the oxide semiconductor layer was observed. FIG. 9 is a graph illustrating the relationship between Von and the electric conductivity of the oxide semiconductor. In FIG. 9, Von denotes the voltage applied to the gate when the drain current (Id) rises with the transfer characteristic of the thin film transistor. The second insulating film of amorphous $SiO_x$ formed by using $O_2$/Ar mixture gas with a mixing ratio of 10 vol % as sputtering gas contained oxygen atoms at a rate of $3.8 \times 10^{19}$/$cm^3$ as observed as desorbed gas by means of TPD.

Then, as a result, the second insulating film of amorphous $SiO_x$ formed by using $O_2$/Ar mixture gas with a mixing ratio of 10 vol % showed an effect of suppressing generation of oxygen defects in the oxide semiconductor. The devices showed a value of Von: −40 V as average value and a good ON/OFF ratio of not less than $10^6$.

Comparative Example 1

In this comparative example, reverse staggered (bottom gate) type MISFET devices as shown in FIG. 11 were prepared as in Example 1 except the conditions for forming the second insulating film.

For each device, an insulating layer of amorphous $SiO_x$ was formed to a thickness of 100 nm as the second insulating film by sputtering. An atmosphere containing $O_2$/Ar mixture gas with a mixing ratio of 1 vol % or 0 vol % was used as sputtering gas. A total of nine reverse staggered (bottom gate) type MISFET devices as shown in FIG. 11 were completed in this way.

As a result, the characteristics of the devices formed by using an $O_2$/Ar mixture gas with a mixing ratio of 1 vol % or 0 vol % were remarkably fluctuated and there were cases where no clear Von was observed by applying a gate electrode of −50 V. Thus, a clear effect of suppressing generation of oxygen defects was not recognized for the oxide semiconductor.

Example 3

In this example, a reverse staggered (bottom gate) type MISFET device illustrated in FIG. 1 was prepared.

Firstly, a gate electrode layer of transparent conductive film IZO was formed to a thickness of 150 nm on a glass substrate by sputtering. The gate electrode was formed by means of photolithography and wet etching using hydrochloric acid. Additionally, an insulating layer of amorphous $SiO_x$ was formed to a thickness of 200 nm thereon also by sputtering. At this time, an $SiO_2$ target was used as sputtering target and Ar gas was used as sputtering gas. The RF high frequency power and the film forming pressure were 400 W and 0.1 Pa respectively. The substrate temperature was room temperature and the substrate was not intentionally heated. Then, an amorphous oxide semiconductor film to be used as semiconductor layer was formed to a thickness of 20 nm by sputtering at room temperature. At this time, a polycrystalline $InGaZnO_4$ target was employed and an $O_2$/Ar gas with a mixing ratio of 5 vol % was used as sputtering gas. The RF high frequency power and the film forming pressure were 200 W and 0.1 Pa respectively. The substrate temperature was room temperature and the substrate was not intentionally heated. The channel regions were formed by means of photolithography and wet etching using hydrochloric acid. Subsequently, a film of amorphous $SiO_x$ was formed to a thickness of 100 nm as the second insulating film by sputtering. At this time, an oxidative gas atmosphere containing $O_2$/Ar gas with a mixing ratio of 50 vol % was used as sputtering gas. The RF high frequency power and the film forming pressure were 400 W and 0.1 Pa respectively. The substrate temperature was room temperature and the substrate was not intentionally heated. Thus, contact regions of the oxide semiconductor layer and the electrodes whose electric resistance was lowered as a result of dry etching by means of photolithography and Ar-containing $CF_4$ gas were completed. At this time, a mixture gas of $CF_4$ gas 20 SCCM and Ar gas 5 SCCM was used as etching gas. The RF high frequency power and the etching pressure were 150 W and 5 Pa respectively. Subsequently, a transparent conductive film ITO was formed to a thickness of 150 nm by sputtering. At this time, an ITO target of Sn 5 mass % was used. The RF high frequency power and the film forming pressure were 200 W and 0.2 Pa respectively. The substrate temperature was room temperature and the substrate was not intentionally heated. Thereafter, source/drain terminals are formed by means of photolithography and etching. In this way, a reverse staggered (bottom gate) type transparent MISFET device as illustrated in FIG. 1 can be formed.

A metal selected from Ni, Cr, Rh, Mo, Nd, Ti, W, Ta, Pb and Al, an alloy containing any of them or a silicide of any of them can be used for the source electrode and the drain electrode in place of a transparent conductive oxide film such as IZO. Additionally, the source electrode and the drain electrode can be formed by means of respective materials that are different from each other.

Channel regions that can stably minimize the OFF current are formed in the reverse staggered (bottom gate) type MISFET device and additionally the electric resistance of the contact regions of the oxide semiconductor layer and the electrodes is lowered. Thus, a thin film transistor showing a minimized OFF current and a good ohmic contact between the source electrode and the drain electrode and the oxide semiconductor layer can be obtained.

Example 4

A display apparatus using a thin film transistor having a structure as shown in FIG. 7 was prepared in this example. The process of manufacturing the thin film transistor is the same as that of Example 3.

In the thin film transistor, the short sides of the island of the ITO film that operates as drain electrode were extended to 100 μm and, after securing the wirings to the source electrode and the gate electrode, the thin film transistor was covered by an insulating layer except the extended 90 μm part. Then, a polyimide film was applied onto the insulating layer and subjected to a rubbing operation. Meanwhile, a piece of work prepared by forming an ITO film and a polyimide film on a similar plastic substrate and subjected to a rubbing operation was brought in and arranged vis-à-vis the substrate on which the thin film transistor was formed with a gap of 5 μm separating them and nematic liquid crystal was injected into the gap. Additionally, a pair of polarizing plates was arranged at opposite sides of the structure. Then, a voltage is applied to the source electrode of the thin film transistor and the voltage being applied to the gate electrode was made to vary. As a result, the optical transmission factor changed only in the region of 30 μm×90 μm that was extended from the drain electrode as a part of the island of the ITO film. The transmission factor could be changed continuously by means of the voltage between the source electrode and the drain electrode in a state where the thin film transistor is turned on by the gate voltage. In this way, a display apparatus having a liquid crystal cell as display device was prepared.

Additionally, in this example, a white plastic substrate was used for the substrate on which the thin film transistor was formed and the electrodes of the thin film transistor were replaced by gold electrodes while the polyimide film and the polarizing plates were eliminated. Then, a capsule formed by coating the particles and the fluid by means of an insulating film coat is put into the gap between the white and transparent plastic substrates. In the case of a display apparatus having the above-described structure, the voltage between the extended drain electrode and the upward ITO film is controlled by the transistor and the particles in the capsule are driven to move up and down. Thus, the display can be operated to display an image by controlling the reflection factor of the drain electrode region extended from the transparent substrate side.

A plurality of thin film transistors can be formed side by side to realize an ordinary current control circuit having four transistors and a capacitor and a thin film transistor as illustrated in FIG. 6 can be used as one of the final stage transistors to drive an EL device. For instance, the thin film transistor may have an ITO film that operates as drain electrode. Then, an organic electroluminescent device having a charge injection layer and a light emitting layer is formed in the 30 μm×90 μm region that is part of the island of the ITO film extended from the drain electrode. A display apparatus using an EL device can be formed in this way.

Example 5

Display devices and thin film transistors as those of Example 4 are arranged two-dimensionally in a rectangle. For instance, pixels formed by using liquid crystal cells or EL devices and thin film transistors like those of Example 4 are arranged to a total of 7,425×1,790 at pitches of 40 μm and 120 μm along the short sides and the long sides of the rectangle respectively. 1,790 gate lines are arranged along the long sides so as to make each of them run through the gate electrodes of 7,425 thin film transistors, whereas 7,425 signal lines are arranged along the short sides so as to make each of them run through the parts of the source electrodes of 1,790 thin film transistors extended by 5 μm from the respective islands of the amorphous oxide semiconductor films thereof. Then, the gate wires and the signal wires are connected respectively to a gate driver circuit and a source driver circuit. When liquid crystal display devices are employed, an active matrix type color image display apparatus of A4 size can be produced with about 211 ppi by arranging color filters of RGB of the size same as the liquid crystal display devices in alignment with the latter so as to make the arrangement of RGB to be repeated along the short side.

When EL devices are employed, an emission type color image display apparatus can be produced with the resolution same as the above-described active matrix type color image display apparatus by connecting the gate electrode of the first thin film transistor of the two thin film transistor contained in each EL device to a gate line and the source electrode of the second thin film transistor to a signal lines and repeating the emission wavelengths of RGB of EL devices along the short sides.

The driver circuit for driving the active matrix may be formed by using thin film transistors according to the present invention that are the same as the thin film transistors of the pixels or an commercially available IC chip may be employed for it.

Example 6

A top gate type MISFET device as illustrated in FIG. 14 is prepared in this example. Firstly, an amorphous semiconductor layer to be used as semiconductor layer is formed on a glass substrate to a thickness of 100 nm by sputtering at room temperature. At this time, a polycrystalline $InGaZnO_4$ target is employed and $O_2$/Ar mixture gas with a mixing ratio of 1.5 vol % is used as sputtering gas. The RF high frequency power and the film forming pressure are 300 W and 0.2 Pa respectively. The substrate temperature is room temperature and the substrate is not intentionally heated. The channel regions are formed by patterning by means of photolithography and wet etching using hydrochloric acid. Then, an insulating layer of amorphous $SiO_x$ is formed as the second insulating film to a thickness of 200 nm thereon by sputtering. At this time, an $SiO_2$ target is used as sputtering target and an oxidative atmosphere of $O_2$/Ar mixture gas with a mixing ratio of 50 vol % is used as sputtering gas. The RF high frequency power and the film forming pressure are 500 W and 0.2 Pa respectively. The substrate temperature is room temperature and the substrate is not intentionally heated. Subsequently, to form the contact regions of the electrode layer and the amorphous oxide semiconductor, the second insulating film is subjected to dry etching, using Ar-containing $CF_4$ gas, for a patterning operation of covering the oxide semiconductor layer except the channel regions. At this time, a mixture gas of $CF_4$ gas 20 SCCM and Ar gas 5 SCCM is used as etching gas. The RF high frequency power and the film forming pressure are 150 W and 5 Pa respectively. Then, an IZO electrode layer is formed for a source electrode, a drain electrode and a gate electrode by sputtering to a thickness of 150 nm on the contact regions of the patterned second insulating film and the amorphous oxide semiconductor layer. At this time, an IZO target with ZnO 10 wt % is used. The RF high frequency power and the film forming pressure are 200 W and 0.2 Pa respectively. The substrate temperature is room temperature and the substrate is not intentionally heated. A source electrode, a drain electrode and a gate electrode are produced by etching and patterning the electrode layer.

A top gate type MISFET device as illustrated in FIG. 14 is formed in this way.

Thus, according to the present invention, the second insulating film is subjected to dry etching, using Ar-containing $CF_4$ gas, for a patterning operation. Then, as a result, a thin film transistor showing good transistor characteristics including a minimized OFF current and a good ohmic contact between the source electrode and the drain electrode and the amorphous oxide semiconductor layer can be prepared on a stable basis.

INDUSTRIAL APPLICABILITY

A thin film transistor produced by a method for manufacturing a thin film transistor according to the present invention can find applications in the field of switching devices of LCDs and organic EL displays. Additionally, all the process of forming a thin film transistor can be conducted on a flexible material such as a plastic film at low temperature. Thus, the present invention can find applications broadly in the field of IC cards and ID tags as well as flexible displays.

This application claims the benefit of Japanese Patent Applications No. 2006-328308, filed Dec. 5, 2006, No. 2007-143503, filed May 30, 2007, No. 2007-273863, filed Oct. 22, 2007, No. 2007-287401, filed Nov. 5, 2007, which are hereby incorporated by reference herein in their entirety.

The invention claimed is:

1. A method of manufacturing a thin film transistor having on a substrate, at least a gate electrode, a first insulating film, an oxide semiconductor layer, a second insulating film, a source electrode and a drain electrode, comprising the steps of:
   forming a gate electrode on a substrate;
   forming a first insulating film on the gate electrode;
   forming an oxide semiconductor layer on the first insulating film with an amorphous oxide containing at least In and Zn;
   patterning the first insulating film;
   patterning the oxide semiconductor layer;
   forming a second insulating film on the oxide semiconductor layer in an oxidative-gas-containing atmosphere;
   patterning the second insulating film to expose a pair of contact regions in the oxide semiconductor layer and lower the electric resistance of the contact regions by generating oxygen defects in the contact regions;
   forming an electrode layer on the pair of contact regions; and
   patterning the electrode layer to form a source electrode and a drain electrode.

2. The method according to claim 1, wherein a mixture gas of $O_2$/Ar is used for the oxidative-gas-containing atmosphere and the mixture ratio is not less than 10 vol %.

3. The method according to claim 1, wherein the amorphous oxide contains In, Zn and Ga.

4. The method according to claim 1, wherein the second insulating film is an amorphous oxide insulator containing oxygen atoms such that the level of $O_2^+$ observed as desorbed gas by means of temperature programmed desorption mass spectrometry is not less than $3.8 \times 10^{19}/cm^3$.

5. A thin film transistor having on a substrate, at least a gate electrode, an oxide semiconductor layer, an insulating film, a source electrode and a drain electrode, and having been manufactured by the manufacturing method according to claim 1.

6. A display apparatus comprising a display device, an electrode for supplying an electric signal to the display device and the thin film transistor according to claim 5 for driving the display device, wherein the source or drain electrode of the thin film transistor is connected to an electrode of the display device.

7. The apparatus according to claim 6, wherein the device is an electroluminescent device.

8. The apparatus according to claim 6, wherein the device is a liquid crystal cell.

9. The apparatus according to claim 6, wherein a plurality of display devices and a plurality of thin film transistors are arranged two-dimensionally on a substrate.

10. A method of manufacturing a thin film transistor having on a substrate, at least a gate electrode, an oxide semiconductor layer, an insulating film, a source electrode and a drain electrode, comprising the steps of:
    forming an oxide semiconductor layer on a substrate with an amorphous oxide containing at least In and Zn;
    patterning the oxide semiconductor layer;
    forming an insulating film on the oxide semiconductor layer in an oxidative-gas-containing atmosphere;
    patterning the insulating film to expose a pair of contact regions in the oxide semiconductor layer and lower the electric resistance of the pair of contact regions by generating oxygen defects in the contact regions;
    forming an electrode layer on the pair of contact regions and on the insulating film; and
    patterning the electrode layer to form a source electrode, a drain electrode and a gate electrode.

* * * * *